US 6,458,287 B1

United States Patent
Nishida et al.

(10) Patent No.: US 6,458,287 B1
(45) Date of Patent: Oct. 1, 2002

(54) PIEZOELECTRIC CERAMIC COMPOSITION AND PIEZOELECTRIC ELEMENT CONTAINING THE SAME

(75) Inventors: Masamitsu Nishida, Osaka; Keiichi Takahashi, Hyogo; Kojiro Okuyama, Nara; Hiroshi Sogou, Hyogo; Junichi Kato, Osaka, all of (JP)

(73) Assignee: Matsushita Electric Industrial Co., Ltd., Kadoma (JP)

(*) Notice: Subject to any disclaimer, the term of this patent is extended or adjusted under 35 U.S.C. 154(b) by 0 days.

(21) Appl. No.: 09/995,512

(22) Filed: Nov. 27, 2001

(51) Int. Cl.[7] ............................................. C04B 35/495
(52) U.S. Cl. ................... 252/62.9 R; 501/134; 501/135
(58) Field of Search ................ 252/62.9 R; 501/134, 501/135

(56) References Cited

FOREIGN PATENT DOCUMENTS

| JP | 7-82024 | 3/1995 |
|---|---|---|
| JP | 2001-72466 | 3/2001 |
| JP | 2001-151573 | 6/2001 |
| JP | 2001-172082 | 6/2001 |
| JP | 2001-240471 | 9/2001 |

Primary Examiner—Elizabeth D. Wood
(74) Attorney, Agent, or Firm—Merchant & Gould PC

(57) ABSTRACT

The present invention provides a piezoelectric ceramic composition that is free from lead and has a small grain size, a high coupling coefficient, a high mechanical Q, and a large frequency constant. This composition is characterized by being expressed by a formula of $(Li_xNa_{1-x-y}K_y)_{z-2w}Ma_{2w}Nb_{1-w}Mb_wO_3$, wherein $0.03 \leq x \leq 0.2$, $0 \leq y \leq 0.2$, $0.98 \leq z \leq 1$, $0 < w \leq 0.05$, Ma indicates at least one element selected from the alkaline-earth metals, and Mb denotes at least one element selected from Bi, Sb, and the rare earth elements.

7 Claims, 1 Drawing Sheet

PIEZOELECTRIC CERAMIC COMPOSITION AND PIEZOELECTRIC ELEMENT CONTAINING THE SAME

BACKGROUND OF THE INVENTION

1. Field of the Invention

The present invention relates generally to a piezoelectric ceramic composition that is useful as a material for piezoelectric elements such as piezoelectric ceramic filters, piezoelectric ceramic vibrators, actuators, piezoelectric transformers, various types of sensors, or the like.

2. Related Background Art

Conventionally, as piezoelectric ceramic materials, lead titanate-based ceramics containing PbTiO, as a main component, lead zirconate titanate-based ceramics containing $Pb(Ti, Zr)O_3$ as a main component, and a multicomponent piezoelectric ceramic that includes some kinds of complex perovskite compositions, for example, $Pb(Mg_{1/3}Nb_{2/3})O_3$, $Pb(Ni_{1/3}Nb_{2/3})O_3$ have been used. With these compositions, piezoelectric ceramics having different characteristics in accordance with the intended uses can be obtained through the suitable selection of a composition ratio of the components thereof. These piezoelectric ceramics are used for ceramic filters, piezobuzzers, piezoelectric spark plugs, ultrasonic piezoelectric transducers, or the like.

However, conventional lead zirconate titanate piezoelectric ceramics have a small frequency constant that is about 2000 Hz·m. Hence, when using such a piezoelectric ceramics, a resonator in which thickness longitudinal vibration occurs in the frequency band of about 10 MHz or higher has an element thickness of 0.2 mm or less, which makes the manufacture thereof difficult. In addition, the above-mentioned conventional materials contain a large amount of lead as a main component, which is not desirable from the viewpoint of environmental protection. The above-mentioned conventional materials have large grain sizes. Generally, materials with large grain sizes have a low mechanical quality factor Qm (hereinafter referred to as "mechanical Q") and have a higher decreasing rate of frequency dependence in a high frequency range. Hence, it was difficult to use them for vibrators used in the high frequency range, for example, in a range of 1 MHz or higher.

Here, the "mechanical Q" is a factor indicating the sharpness of resonance in vibration, and the sharpness of a resonance curve increases with an increase in the value thereof.

SUMMARY OF THE INVENTION

Hence, an object of the present invention is to provide a piezoelectric ceramic composition that is manufactured easily by an ordinary sintering method and has a high coupling coefficient, a large frequency constant, a small grain size, and a high mechanical Q at least in its preferable embodiment. Another object of the present invention is to provide a piezoelectric element including this piezoelectric ceramic composition.

In one aspect of the present invention, a piezoelectric ceramic composition is expressed by a formula of $(Li_xNa_{1-x-y}K_y)_{z-2w}Ma_{2w}Nb_{1-w}Mb_wO_3$.

In the above formula, $0.03 \leq x \leq 0.2$, $0 \leq y \leq 0.2$, $0.98 \leq z \leq 1$, $0 < w \leq 0.05$, Ma indicates at least one element selected from the alkaline-earth metals, and Mb denotes at least one element selected from Bi, Sb, and the rare earth elements (Sc, Y. and lanthanide series elements).

In the above, the value of x is defined as $0.03 \leq x \leq 0.2$. This is because sintering characteristics deteriorate when the value of x is out of this range. The value of x is further preferably at least 0.07 and particularly preferably 0.17 or lower.

In the above, the value of y is defined as $0 \leq y \leq 0.2$. This is because the coupling coefficient may decrease when the value of y is out of this range. The increase in the value of y within this range permits an increase in dielectric constant.

In the above, the value of z is defined as $0.98 \leq z \leq 1$. This is because a value of z of lower than 0.98 does not allow the mechanical Q to be improved to a sufficiently high degree.

In the above, the value of w is defined as $0 < w \leq 0.05$. This is because when the value of w is out of this range, the grain size may increase and the coupling coefficient may decrease. The value of w is preferably at least 0.001, further preferably at least 0.005, and particularly preferably 0.03 or lower.

The present invention further provides a piezoelectric element including the above-mentioned piezoelectric ceramic composition.

DETAILED DESCRIPTION OF THE INVENTION

A preferable embodiment of the present invention is described as follows.

In the piezoelectric ceramic composition of the present invention, a preferable Ma includes at least one selected from Sr, Ca, and Ba, and a preferable Mb includes at least one element selected from Bi, Sb, Y, Sm, Er, Ho, Tm, Lu, and Yb.

In the piezoelectric ceramic composition of the present invention, preferably, at least one element selected from Mn, Cr, and Co is added so as to have a ratio thereof to the whole of 0.01 to 1 wt % in terms of $MnO_2$, $Cr_2O_3$, and CoO, respectively. In this case, the amount of the element to be added is set to be 1 wt % or less. This is because when the ratio is out of this range, the effect of improving the mechanical Q cannot be obtained to a high degree. This ratio of the element to be added is further preferably at least 0.1 wt % and particularly preferably 0.5 wt % or lower when being expressed in the same manner as above.

In the piezoelectric ceramic composition of the present invention, preferably, at least one element selected from W, Ni, Al, and Sn is added so as to have a ratio thereof to the whole of 0.01 to 1 wt % in terms of $WO_3$, NiO, $Al_2O_3$, and $SnO_2$, respectively. In this case, the amount of the element to be added is set to be 1 wt % or less. This is because when the ratio is out of this range, the effect of improving the mechanical Q may not be obtained to a high degree. This ratio of the element to be added is further preferably at least 0.1 wt % and particularly preferably 0.5 wt % or lower when being expressed in the same manner as above.

Figure 1:
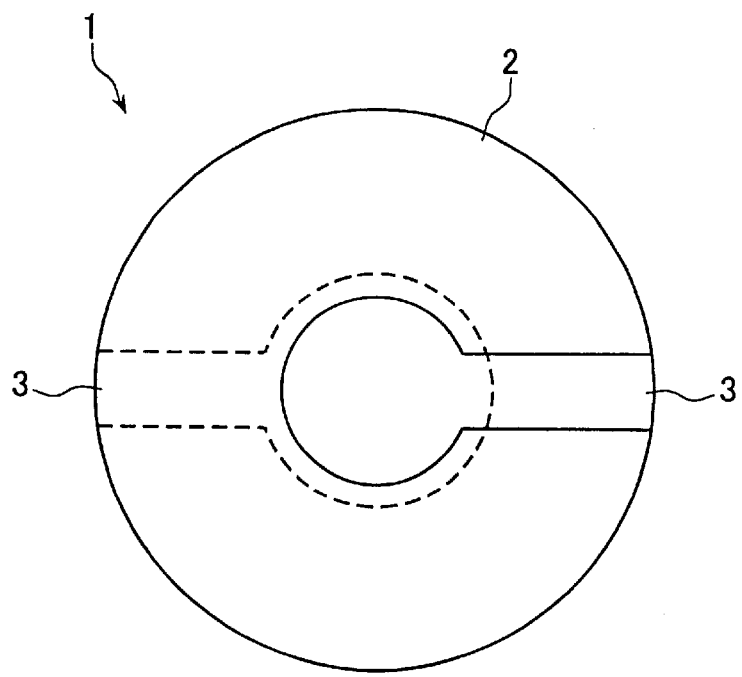
FIG. 1 is a plan view showing an example of a piezoelectric element according to the present invention.

A composition of the present invention can be used, for instance, for an energy-trapping-type resonator as shown in FIG. 1. This piezoelectric element 1 is composed of a piezoelectric ceramic 2 and electrodes 3. For instance, Cr—Au electrodes may be used as the electrodes. Thus, a piezoelectric element used in a high frequency band can be provided.

Figure 2:
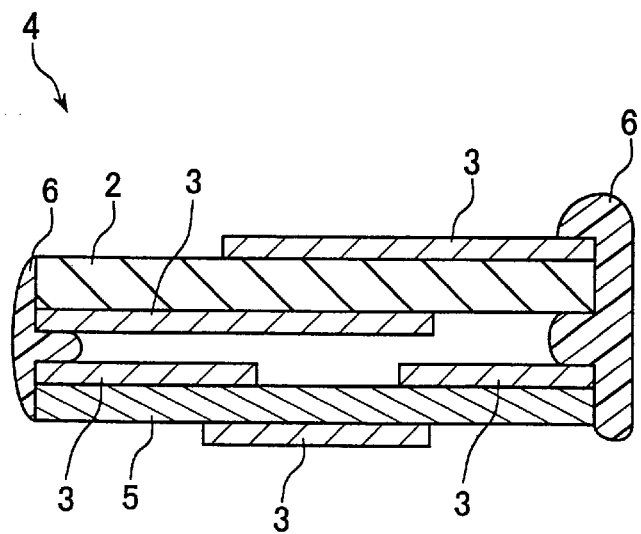
FIG. 2 is a sectional view showing an example of a piezo-resonator according to the present invention.

A composition of the present invention also may be used for a piezo-resonator as shown in FIG. 2. This piezo-resonator 4 includes a capacitative element 5 together with a piezoelectric ceramic 2 and they are connected to each other with an electrically conductive adhesive 6 in the state where electrodes 3 are formed. For example, a barium titanate ceramic can be used as the capacitative element. An adhesive mainly containing silver powder and epoxy resin may be used as the electrically conductive adhesive, for instance. The variation in temperature change rate of capacitance of the capacitive element allows the temperature characteristic of the resonant frequency of the piezo-resonator to be controlled. Here, the operation modes of the above-mentioned piezoelectric element and piezo-resonator are not limited to a thickness extensional vibration mode but may be a thickness shear mode.

The piezoelectric ceramic composition of the present invention is particularly suitable for low-loss resonators used at high frequencies since it has a high mechanical Q and a small grain size. In addition, the frequency constant reaches about 1.5 times that of a conventional lead-zirconate-titanate-based piezoelectric ceramic composition. Hence, in a resonator that is operated in a thickness longitudinal vibration mode at the same frequency as that used by a conventional resonator, its thickness increases to about 1.5 times the conventional one. Thus, a particularly useful effect can be obtained in the application of the piezoelectric ceramic composition according to the present invention in a high-frequency band. The piezoelectric ceramic composition of the present invention has a high coupling coefficient and thus is particularly suitable for various sensors such as an acceleration sensor, actuators, or the like. Furthermore, the piezoelectric ceramic composition of the present invention does not contain lead and therefore also is preferable from the viewpoint of environmental protection.

EXAMPLE

Initially, $Li_2CO_3$, $Na_2CO_3$, $K_2CO_3$, $Nb_2O_5$, $SrCO_3$, $CaCO_3$, $BaCO_3$, $Bi_2O_3$, $Sb_2O_3$, $Y_2O_3$, $Sm_2O_3$, $Er_2O_3$, $Ho_2O_3$, $Tm_2O_3$, $Lu_2O_3$, $Yb_2O_3$, $Mn_3O_4$, $Cr_2O_3$, $CoO$, $WO_3$, $SnO_2$, $Al_2O_3$, and $NiO$ were prepared as raw materials. Raw materials suitably selected from them were weighed to have composition ratios shown in Tables 1-1 and 1-2. Next, powders of the raw materials thus weighed were mixed with ethanol for 20 hours using a ball mill, and the mixture was dried and was calcined at 750 to 1100° C. for two hours. After being coarsely pulverized, the calcined body thus obtained was further pulverized with ethanol for 15 hours in a ball mill, which then was dried. Afterward, an organic binder was added thereto and the mixture was granulated, which then was formed under a pressure of 70 MPa into a disc-like green compact with a diameter of 13 mm and a thickness of 1 mm. This was sintered at a temperature between 900° C. and 1250° C. for one hour. After sintering, each of the ceramics with the highest density among the respective compositions was ground to have a thickness of 0.35 mm and then Cr—Au was deposited on both faces thereof to form electrodes. This element thus obtained was subjected to polarization through application of a direct electric field of 3 to 7 kV/mm between the electrodes in silicone oil at a temperature of 100 to 200° C. for 30 minutes.

The ceramic compositions prepared by the steps described above subjected to measurements of average grain size, dielectric constant, thickness-longitudinal-vibration electromechanical coupling coefficient kt, mechanical Q. The results are shown in Tables 1 and 2.

In Table 1, the samples indicated with the mark * are ceramic compositions of comparative examples that are out of the range of the present invention.

TABLE 1

$(Li_xNa_{1-x-y}K_y)_{z-2w}Ma_{2w}Nb_{1-w}Mb_wO_3$

| Sample Nos. | Composition | | | | | | Added Material | | Average Grain Size [μm] | Specific Dielectric Constant | Coupling Coefficient kt | Mechanical Q |
|---|---|---|---|---|---|---|---|---|---|---|---|---|
| | z | x | y | Ma | Mb | w | A (wt %) | B (wt %) | | | | |
| 1* | 0.99 | 0.12 | — | — | — | — | — | — | 46 | 116 | 0.32 | 290 |
| 2* | 0.99 | 0.25 | — | Sr | Bi | 0.02 | — | — | 2.2 | 110 | 0.18 | 80 |
| 3 | 0.99 | 0.20 | — | Sr | Bi | 0.02 | — | — | 2.6 | 112 | 0.30 | 340 |
| 4 | 0.99 | 0.17 | — | Sr | Bi | 0.02 | — | — | 2.8 | 116 | 0.34 | 360 |
| 5 | 0.99 | 0.12 | — | Sr | Bi | 0.02 | — | — | 3.2 | 123 | 0.35 | 420 |
| 6 | 0.99 | 0.07 | — | Sr | Bi | 0.02 | — | — | 3.6 | 118 | 0.42 | 410 |
| 7 | 0.99 | 0.03 | — | Sr | Bi | 0.02 | — | — | 3.6 | 112 | 0.39 | 390 |
| 8 | 0.99 | 0.12 | — | Ca | Y | 0.01 | — | — | 3.0 | 121 | 0.37 | 380 |
| 9 | 0.99 | 0.12 | — | Ba | Sb | 0.005 | — | — | 4.1 | 114 | 0.35 | 360 |
| 10 | 0.99 | 0.12 | — | Ba | Sb | 0.02 | — | — | 1.2 | 126 | 0.43 | 420 |
| 11 | 0.99 | 0.12 | — | Ba | Sb | 0.03 | — | — | 1.1 | 130 | 0.41 | 390 |
| 12 | 0.99 | 0.12 | — | Ba | Sb | 0.05 | — | — | 1.0 | 142 | 0.38 | 370 |
| 13 | 0.99 | 0.12 | — | Ba | Sm | 0.01 | — | — | 2.1 | 129 | 0.41 | 460 |
| 14 | 0.99 | 0.12 | — | Ba | Er | 0.02 | — | — | 3.2 | 125 | 0.41 | 350 |
| 15 | 0.99 | 0.12 | — | Ba | Ho | 0.02 | — | — | 1.6 | 119 | 0.43 | 390 |
| 16 | 0.99 | 0.12 | — | Ba | Tm | 0.02 | — | — | 2.7 | 121 | 0.40 | 420 |
| 17 | 0.99 | 0.12 | — | Ba | Lu | 0.02 | — | — | 2.1 | 118 | 0.36 | 340 |
| 18 | 0.99 | 0.12 | — | Ba | Yb | 0.02 | — | — | 1.3 | 113 | 0.45 | 380 |
| 19 | 0.99 | 0.12 | 0.02 | Ba | Yb | 0.02 | — | — | 2.3 | 149 | 0.44 | 410 |
| 20 | 0.99 | 0.12 | 0.05 | Ba | Yb | 0.02 | — | — | 2.3 | 175 | 0.42 | 450 |
| 21 | 0.99 | 0.12 | 0.20 | Ba | Yb | 0.02 | — | — | 2.7 | 233 | 0.34 | 380 |
| 22* | 0.99 | 0.12 | 0.40 | Ba | Yb | 0.02 | — | — | 2.8 | 384 | 0.26 | 240 |
| 23 | 1.00 | 0.12 | — | Ba | Sm | 0.01 | — | — | 3.6 | 131 | 0.40 | 420 |
| 24 | 0.98 | 0.12 | — | Ba | Sm | 0.01 | — | — | 3.4 | 127 | 0.39 | 360 |
| 25* | 0.96 | 0.12 | — | Ba | Sm | 0.01 | — | — | 3.7 | 121 | 0.38 | 160 |

TABLE 2

$(Li_xNa_{1-x-y}K_y)_{z-2w}Ma_{2w}Nb_{1-w}Mb_wO_3$

| Sample Nos. | Composition | | | | | | Added Material | | Average Grain Size [μm] | Specific Dielectric Constant | Coupling Coefficient kt | Mechanical Q |
|---|---|---|---|---|---|---|---|---|---|---|---|---|
| | z | x | y | Ma | Mb | w | A (wt %) | B (wt %) | | | | |
| 26 | 0.99 | 0.12 | — | Ba | Sb | 0.02 | 0.2 MnO$_2$ | — | 1.0 | 128 | 0.41 | 640 |
| 27 | 0.99 | 0.12 | — | Ba | Sb | 0.02 | 0.5 MnO$_2$ | — | 0.8 | 125 | 0.40 | 950 |
| 28 | 0.99 | 0.12 | — | Ba | Sb | 0.02 | 1.0 MnO$_2$ | — | 1.4 | 121 | 0.36 | 450 |
| 29 | 0.99 | 0.12 | — | Sr | Bi | 0.02 | 0.2 Cr$_2$O$_3$ | — | 2.1 | 119 | 0.37 | 510 |
| 30 | 0.99 | 0.12 | — | Sr | Bi | 0.02 | 0.5 Cr$_2$O$_3$ | — | 1.2 | 121 | 0.37 | 770 |
| 31 | 0.99 | 0.12 | — | Sr | Bi | 0.02 | 1.0 Cr$_2$O$_3$ | — | 2.5 | 113 | 0.35 | 530 |
| 32 | 0.99 | 0.12 | — | Ca | Y | 0.01 | 0.1 CoO | — | 2.3 | 119 | 0.35 | 490 |
| 38 | 0.99 | 0.12 | — | Ca | Y | 0.01 | 0.5 CoO | — | 1.8 | 121 | 0.34 | 840 |
| 34 | 0.99 | 0.12 | — | Ca | Y | 0.01 | 1.0 CoO | — | 2.6 | 115 | 0.34 | 520 |
| 35 | 0.99 | 0.12 | — | Ba | Sb | 0.02 | — | 0.2 WO$_3$ | 1.3 | 127 | 0.45 | 490 |
| 36 | 0.99 | 0.12 | — | Ba | Sb | 0.02 | — | 1.0 WO$_3$ | 1.1 | 124 | 0.47 | 520 |
| 37 | 0.99 | 0.12 | — | Ba | Yb | 0.02 | — | 0.5 NiO | 1.6 | 116 | 0.47 | 440 |
| 38 | 0.99 | 0.12 | — | Ba | Yb | 0.02 | — | 1.0 NiO | 1.8 | 117 | 0.49 | 510 |
| 39 | 0.99 | 0.12 | — | Ba | Sm | 0.01 | — | 0.2 Al$_2$O$_3$ | 2.1 | 128 | 0.43 | 560 |
| 40 | 0.99 | 0.12 | — | Ba | Sm | 0.01 | — | 1.0 Al$_2$O$_3$ | 2.6 | 129 | 0.42 | 480 |
| 41 | 0.99 | 0.12 | 0.02 | Ba | Yb | 0.02 | — | 0.5 Al$_2$O$_3$ | 2.7 | 124 | 0.46 | 460 |
| 42 | 0.99 | 0.12 | 0.02 | Ba | Yb | 0.02 | — | 1.0 SnO$_2$ | 2.9 | 117 | 0.45 | 530 |
| 43 | 0.99 | 0.12 | — | Ba | Sb | 0.02 | 0.5 MnO$_2$ | 0.2 WO$_3$ | 1.1 | 117 | 0.39 | 1230 |
| 44 | 0.99 | 0.12 | — | Ba | Sb | 0.02 | 0.5 MnO$_2$ | 0.5 NiO | 1.4 | 113 | 0.42 | 1090 |
| 45 | 0.99 | 0.12 | — | Sr | Bi | 0.02 | 0.2 Cr$_2$O$_3$ | 0.2 Al$_2$O$_3$ | 2.3 | 127 | 0.40 | 1020 |
| 46 | 0.99 | 0.12 | — | Ca | Y | 0.01 | 0.5 CoO | 0.5 SnO$_2$ | 2.6 | 133 | 0.37 | 1140 |

All the above-mentioned samples had a frequency constant Nt of thickness longitudinal vibration in a range of 2700 to 3200 Hz·m. This corresponds to about 1.5 times the value of a conventional lead-zirconate-titanate-based piezoelectric ceramic.

As is apparent from Tables 1 and 2, in the respective examples, piezoelectric ceramic compositions were obtained that had an average grain size of 10 μm or smaller, particularly 5 μm or smaller, and a mechanical Q of at least 340.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A piezoelectric ceramic composition, expressed by a formula of $(Li_xNa_{1-x-y}K_y)_{z-2w}Ma_{2w}Nb_{1-w}Mb_wO_3$, wherein $0.03 \leq x \leq 0.2$, $0 \leq y \leq 0.2$, $0.98 \leq z \leq 1$, $0 < w \leq 0.05$, Ma indicates at least one element selected from alkaline-earth metals, and Mb denotes at least one element selected from Bi, Sb, and rare earth elements.

2. The piezoelectric ceramic composition according to claim 1, wherein the piezoelectric ceramic composition comprises at least one selected from Mn, Cr, and Co that is added thereto so as to have a ratio thereof to the whole of 0.01 to 1 wt % in terms of MnO$_2$, Cr$_2$O$_3$, and CoO, respectively.

3. The piezoelectric ceramic composition according to claim 1, wherein the piezoelectric ceramic composition comprises at least one selected from W, Ni, Al, and Sn that is added thereto so as to have a ratio thereof to the whole of 0.01 to 1 wt % in terms of WO$_3$, NiO, Al$_2$O$_3$, and SnO$_2$, respectively.

4. The piezoelectric ceramic composition according to claim 1, wherein the piezoelectric ceramic composition has an average grain size of 10 μm or smaller.

5. The piezoelectric ceramic composition according to claim 1, wherein Mb indicates at least one element selected from Bi, Sb, Y, Sm, Er, Ho, Tm, Lu, and Yb.

6. A piezoelectric element, comprising a piezoelectric ceramic composition according to claim 1.

7. The piezoelectric element according to claim 6, further comprising a capacitative element.

* * * * *